(12) United States Patent
Terasawa

(10) Patent No.: US 6,860,610 B2
(45) Date of Patent: Mar. 1, 2005

(54) REFLECTION TYPE PROJECTION OPTICAL SYSTEM, EXPOSURE APPARATUS AND DEVICE FABRICATION METHOD USING THE SAME

(75) Inventor: Chiaki Terasawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/359,937

(22) Filed: Feb. 6, 2003

(65) Prior Publication Data

US 2003/0147149 A1 Aug. 7, 2003

(30) Foreign Application Priority Data

Feb. 7, 2002 (JP) ........................................ 2002-030623

(51) Int. Cl.[7] .............................. G02B 5/08; G02B 5/10
(52) U.S. Cl. ...................................... 359/857; 359/859
(58) Field of Search ................................. 359/857–859, 359/861, 869, 868, 838, 850, 853; 355/53; 353/40

(56) References Cited

U.S. PATENT DOCUMENTS

| 5,805,365 | A | | 9/1998 | Sweatt ........................ 359/858 |
| 5,973,826 | A | * | 10/1999 | Chapman et al. ........... 359/731 |
| 6,109,756 | A | | 8/2000 | Takahashi .................... 359/857 |
| 6,199,991 | B1 | | 3/2001 | Braat ........................... 359/854 |
| 6,213,610 | B1 | | 4/2001 | Takahashi et al. ........... 359/858 |
| 6,302,548 | B2 | | 10/2001 | Takahashi et al. .......... 359/858 |
| 6,495,839 | B1 | * | 12/2002 | Dinger ........................ 359/861 |
| 2002/0018309 | A1 | * | 2/2002 | Braat ........................... 359/850 |

FOREIGN PATENT DOCUMENTS

DE 10157045 9/2002

OTHER PUBLICATIONS

Optical Engineering, Journal of the Society of Photo–Optical Instrumentation Engineers: "Cassegrainian–inverse Cassegrainian four–aspherical mirror system (magnification=+1) derived from the solution of all zero third–order aberrations and suitable for deep–ultraviolet optical lithography"; Jul. 1994, vol. 33, No. 7, pp. 2480–2486.

Optical Engineering, Journal of the Society of Photo–Optical Instrumentation Engineers: "Improved four–mirror optical system for deep–ultraviolet submicrometer lithography"; Mar. 1993; vol. 32, No. 3, pp. 536–541.

"Improved four–mirror optical system for deep–ultraviolet submicrometer lithography", Optical Engineer, 33(1994), No. 3, Bellingham, WA, US, pp. 536–541.

"Cassegrainian–inverse Cassegrainian four–aspherical mirror system (magnification = +1) derived from the solution of all zero third–order aberrations and suitable for deep–ultraviolet optical lithography", Optical Engineering 33(1994)Jul., No. 7, Bellingham, WA, US.

* cited by examiner

Primary Examiner—Georgia Epps
Assistant Examiner—Alicia M. Harrington
(74) Attorney, Agent, or Firm—Morgan & Finnegan, LLP

(57) ABSTRACT

A reflection type projection optical system for projecting a pattern on an object surface onto an image surface and forming an imaging system that forms an intermediate image between the object surface and image surface includes four or more mirrors arranged substantially as a coaxial system to reflect light from an object side to an image side, reflection surfaces on the four or more mirrors forming the same direction for forming a reflection angle.

19 Claims, 6 Drawing Sheets

REFLECTION TYPE PROJECTION OPTICAL SYSTEM, EXPOSURE APPARATUS AND DEVICE FABRICATION METHOD USING THE SAME

BACKGROUND OF THE INVENTION

The present invention relates generally to exposure apparatuses, and more particularly to a reflection type (cataoptric) projection optical system, an exposure apparatus, and a device fabricating method using the same. The reflection type projection optical system use ultraviolet ("UV") and extreme ultraviolet ("EUV") light to project and expose an object, such as a single crystal substrate for a semiconductor wafer, and a glass plate for a liquid crystal display ("LCD").

Along with recent demands for smaller and lower profile electronic devices, finer semiconductor devices to be mounted onto these electronic devices have been increasingly demanded. For example, the design rule for mask patterns has required that an image with a size of a line and space ("L & S") of less than 0.1 μm be extensively formed and it is expected to require circuit patterns of less than 80 nm in the near future. The L & S denotes an image projected onto a wafer in exposure with equal line and space widths, and serves as an index of exposure resolution.

A projection exposure apparatus as a typical exposure apparatus for fabricating semiconductor devices includes a projection optical system for projecting and exposing a pattern on a mask or a reticle (these terms are used interchangeably in the present application), onto a wafer. The resolution R of the projection exposure apparatus (i.e., a minimum size for a precise image transfer) can be defined using a light-source wavelength λ and the numerical aperture ("NA") of the projection optical system as in the following equation:

$$R = k_1 \times \frac{\lambda}{NA} \quad (1)$$

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light limits usable glass materials for transmitting the light, it is advantageous for the projection optical system to use reflection elements, i.e., mirrors instead of using many refraction elements, i.e., lenses. No applicable glass materials have been proposed for the EUV light as exposure light, and a projection optical system could not include any lenses. It has thus been proposed to form a reflection type reduction projection optical system only with mirrors.

A mirror in a reflection type reduction projection optical system forms a multilayer film to enhance reflected light and increase reflectance, but the smaller number of mirrors is desirable to increase reflectance of the entire optical system.

In addition, the projection optical system preferably uses the even number of mirrors to avoid mechanical interference between the mask and the wafer by arranging the mask and the wafer at opposite sides with respect to a pupil. Apparently, a two-mirror system is the minimum number, but it is difficult to maintain a high NA and good imaging performance only with two mirrors due to its limited freedom of design. Accordingly, Japanese Laid-Open Patent Application No. 2000-98228 has proposed a projection optical system including four mirrors.

In a reflection type projection optical system 1000 as the four-mirror system (M1–M4) as proposed in Japanese Laid-Open Patent Application No. 2000-98228, the incident light onto the mirror M1 and reflected light are close to each other near a stop AS as shown in FIG. 7. As a result, it becomes difficult to arrange one aperture stop and instead two non-circular stops become needed, disadvantageously causing the configuration complex. Here, FIG. 7 is a schematic sectional view of the conventional reflection type projection optical system 1000.

In addition, an exposure apparatus 2000 incorporated with the reflection type projection optical system 1000 arranges the mirror M2 closer to the object side than the stop AS, and a mechanism for holding the mirror M2 and a stop mechanism may possibly interfere with (or intercept) the illumination light incoming from a side direction of the projection optical system 1000, lowering the imaging performance. Here, FIG. 8 is a schematic structural view of the exposure apparatus 2000 incorporated with the reflection type projection optical system 1000.

BRIEF SUMMARY OF THE INVENTION

Accordingly, it is an exemplified object of the present invention to provide a reflection type projection optical system with a simple configuration and good imaging performance, an exposure apparatus using the same, and a device fabrication method.

A reflection type projection optical system according one aspect of the present invention for projecting a pattern on an object surface onto an image surface and for serving as an imaging system that forms an intermediate image between the object surface and image surface includes four or more mirrors arranged substantially as a coaxial system to reflect light from an object side to an image side, and reflection surfaces on the four or more mirrors forming the same direction for forming a reflection angle.

The reflection type projection optical system may be a twice-imaging system, and the four or more mirrors may include, in order along an optical path from the intermediate image to the image surface, a convex mirror whose convex surface faces the object side, and a concave mirror whose concave surface faces the image side. The reflection type projection optical system may further include an aperture stop closer to the object side than the four or more mirrors and arranges the four or more mirrors between the aperture stop and the image surface.

The four or more mirrors may include two mirrors between the object surface and the intermediate image. The two mirrors include, in order along an optical path from the object surface to the intermediate image, a concave mirror whose concave surface faces the object side, and a convex mirror whose convex mirror faces the image side.

A reflection type projection optical system according to another aspect of the present invention for projecting a pattern on an object surface onto an image surface includes four mirrors that include, in order from an object side to an image side, a concave mirror, a convex mirror, a convex mirror and a concave mirror, and substantially form a coaxial system, and the four mirrors serving as a twice-imaging system that forms an intermediate image between the object side and the image side.

At least one or all of the mirrors may include an aspheric mirror including a multilayer film. The light may a wavelength of 200 nm or less, or be extreme ultraviolet light having a wavelength of 20 nm or less. The reflection type projection optical system may be telecentric at the image surface side.

An exposure apparatus of another aspect of the present invention uses ultraviolet light, far ultraviolet light, vacuum ultraviolet light or extreme ultraviolet light as exposure light and irradiates the exposure light onto an object to be exposed through the above reflection type projection optical system so as to expose the object.

A device fabricating method includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
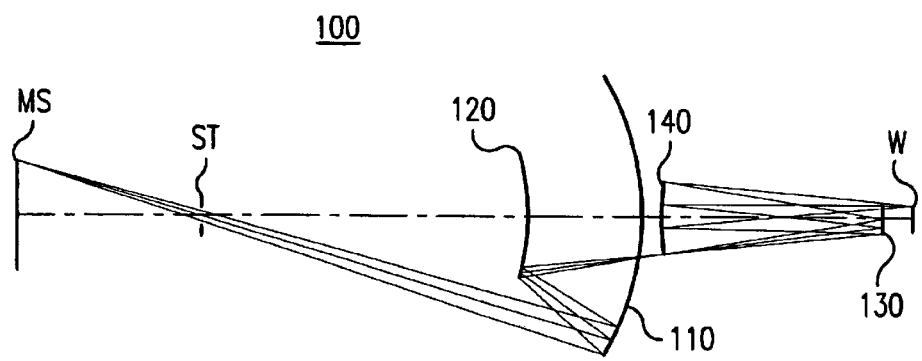
FIG. 1 is a schematic sectional view showing a reflection type projection optical system and its optical path of one embodiment according to the present invention.
Figure 2:
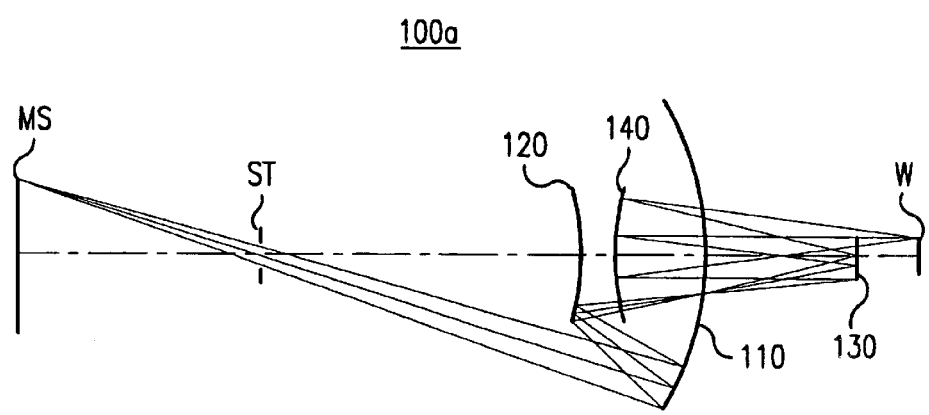
FIG. 2 is a schematic sectional view showing a reflection type projection optical system and its optical path of another embodiment according to the present invention.
Figure 3:
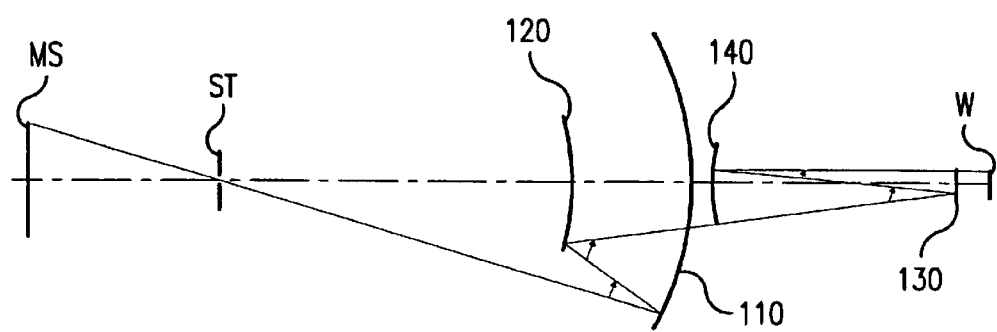
FIG. 3 is a schematic sectional view showing an optical path of a principal ray of the reflection type projection optical system shown in FIG. 1.

A description will now be given of a reflection type projection optical system 100 and an exposure apparatus 200 as one aspect of the present invention with reference to the accompanying drawings. The present invention is not limited to these embodiments and each element is replaceable within a scope that achieves the objects of the present invention. The same reference numeral in each figure denotes the same element, and a description thereof will be omitted. Here, FIG. 1 is a schematic sectional view showing the reflection type projection optical system 100 and its optical path of one embodiment according to the present invention. FIG. 2 is a schematic sectional view showing a reflection type projection optical system 100a and its path as a variation of the reflection type reduction projection optical system 100 shown in FIG. 1. Unless otherwise specified, the reflection type projection optical system 100 generalizes the reflection type reduction projection optical system 100a. FIG. 3 is a schematic sectional view showing an optical path of a principal ray of the reflection type projection optical system 100 shown in FIG. 1.

Referring to FIG. 1, the inventive reflection type projection optical system 100 (hereinafter simply called "projection optical system 100") reduces and projects a pattern on an object surface (MS), such as a mask surface, onto an image surface (W), such as a substrate surface and an object surface to be exposed. The reflection type projection optical system 100 is an optical system particularly suitable for the EUV light (with a wavelength of, for example, 13.4 nm). The projection optical system 100 includes four mirrors that substantially have, in order of reflecting light from the object surface (MS) side, a first (concave) mirror 110, a second (convex) mirror 120, a third (convex) mirror 130, and a fourth (concave) mirror 140. An aperture stop ST is located closer to the object surface (MS) side than the first to fourth mirrors 110 to 140.

The inventive projection optical system 100 is arranged substantially as a coaxial system, i.e., a coaxial optical system that is axially symmetrical around one optical axis. However, the respective mirrors 110 to 140 in the projection optical system 100 do not have to be arranged to be perfectly coaxial so as to correct or adjust aberration. For example, they may slightly decenter for aberrational improvements.

The projection optical system 100 arranges the first to fourth mirrors 110 to 140 such that an intermediate image using the first mirror 110 and second mirror 120, and the intermediate image is imaged again on the image surface (W) using the third mirror 130 and fourth mirror 140. In other words, it employs the symmetrical power arrangement in order of an object surface, positive, negative, an intermediate image surface, negative, positive, and an image surface, which is structurally advantageous to correct aberration. For example, the symmetrical type is generally advantageous to correct the distortion, coma aberration, etc. Therefore, as shown by arrows in FIG. 3, reflection surfaces on all the mirrors 110 to 140 form the same direction for forming a reflection angle in an upper direction on the paper. Similarly, part including the first and second mirrors 110 and 120 may include four mirrors from the object surface (MS) side to the intermediate image. The order of mirrors, in turn, is a concave surface, a concave surface, a convex surface, and a convex surface or a concave surface, a convex surface, a concave surface, and a convex surface.

The inventive projection optical system 100 of such a configuration is a four-mirror system, and advantageously increases the reflectance in the entire optical system. The aperture stop ST is located closest to the object surface (MS) side in the projection optical system 100, and does not include a reflected beam or another mirror near there. Therefore, the aperture stop ST may be made circular, easily avoiding interference between light and aperture stop and interference with the illumination light, which have been problems in the conventional configuration, as discussed above. Thus, the instant embodiment realizes the configuration that does not easily cause interferences, and solves the problems in the conventional configuration. The outgoing light in the projection optical system 100 is maintained telecentric at the side of the image surface (W), and the magnifying power is less affected even when the image surface (W) moves along the optical-axis direction.

As the projection optical system 100 is arranged as a coaxial system, it may advantageously correct aberration in the ring-shaped image surface around the optical axis as a center. The projection optical system 100 is an intermediate-image forming optical system, and provides well-balanced aberrational corrections.

The first to fourth mirrors 110 to 140 are convex or concave mirrors as described above, but the present invention does not limit the mirrors 110 to 140 to a combination of the above convex and concave mirrors. Of course, a formation of an intermediate image using the first and second mirrors 110 and 120 as in the instant embodiment, and a reformation of the image using the third and forth mirrors 130 and 140 would determine shapes of some mirrors to some extent.

Preferably, the third and fourth mirrors 130 and 140 are convex and concave mirrors, respectively, for imaging with a predetermined NA and a back focus. Here, a "back focus" means an interval between the last mirror surface and the image surface (W). The first mirror 110 should be a concave mirror to reflect the principal ray from the object surface (MS) and brings it close to the optical axis. The second mirror 120 should be a concave mirror to reflect the EUV light reflected by the first mirror 110, to form an intermediate image, and to introduce it to the third mirror 130 at a desired angle. The mirror shape should be determined as described later so that the sum of the Petzval terms may be zero or in the neighborhood of zero.

Although the instant embodiment configures, as described above, the first to fourth mirrors 110 to 140 as a concave or convex mirror, and forms aspheric shapes on their reflection surfaces, at least one or more mirrors out of the first to fourth mirrors 110 to 140 have an aspheric surface according to the present invention. As a mirror having an aspheric surface advantageously facilitates a correction of aberration, the aspheric surface is preferably applied to many possible (desirably, four) mirrors. A shape of the aspheric surface in these first to fourth mirrors 110 to 140 is defined as Equation 2 as an equation of a generic aspheric surface:

$$Z = \frac{ch^2}{1 + \sqrt{1 - (1+k)c^2h^2}} + Ah^4 + Bh^6 + Ch^8 + Dh^{10} + Eh^{12} + Fh^{14} + Gh^{16} + Hh^{18} + Jh^{20} + \ldots \quad (2)$$

where "Z" is a coordinate in an optical-axis direction, "c" is a curvature (i.e., a reciprocal number of the radius r of curvature), "h" is a height from the optical axis, "k" a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

These four, i.e., first to fourth, mirrors 110 to 140 have the sum of the Petzval terms in the neighborhood of zero or preferably zero in order to flatten the image surface (W) in the optical system. Thereby, a sum of refracting power of each mirror surface is made nearly zero. In other words, where $r_{110} \sim r_{140}$ are the radii of curvature for respective mirrors (in which subscripts correspond to the reference numerals of the mirrors), the first to fourth mirrors 110 to 140 in this embodiment meet the Equation 3 or 4:

$$\frac{1}{r_{110}} - \frac{1}{r_{120}} + \frac{1}{r_{130}} - \frac{1}{r_{140}} = 0 \quad (3)$$

$$\frac{1}{r_{110}} - \frac{1}{r_{120}} + \frac{1}{r_{130}} - \frac{1}{r_{140}} \approx 0 \quad (4)$$

A multilayer film for reflecting the EUV light is applied onto the surface of the mirrors 110 to 140, and serves to enhance the light. A multilayer applicable to the mirrors 110 to 140 of the instant embodiment includes, for example, a Mo/Si multilayer film including alternately laminated molybdenum (Mo) and silicon (Si) layers on a mirror's reflection surface or a Mo/Be multilayer film including alternately laminating molybdenum (Mo) and beryllium (Be) layers on the mirror's reflection surface. A mirror including the Mo/Si multilayer film may obtain reflectance of 67.5% for a wavelength range near a wavelength of 13.4 nm, and a mirror including the Mo/Be multilayer film may obtain reflectance of 70.2% for a wavelength range near a wavelength of 11.3 nm. Of course, the present invention does not limit the multilayer film to the above materials, and may use any multilayer film that has an operation or effect similar to that of the above.

The aperture stop ST is adapted to be a variable aperture stop to limit or vary the NA. The aperture stop ST as a variable stop advantageously provides a deeper depth of focus suitable for stabilization of images.

A description will now be given of illumination experiment results using the inventive reflection type projection optical systems 100 and 100a. In FIGS. 1 and 2, MS is a reflection type mask located at the object surface, and W is a wafer located at the image surface. The reflection type projection optical systems 100 and 100a illuminate the mask MS using an illumination system (not shown) for emitting the EUV light with a wavelength of about 13.4 nm, and reflects the reflected EUV light from the mask MS via the first (concave) mirror 110, second (convex) mirror 120, third (convex) mirror 130, and fourth (concave) mirror 140 arranged in this order. Then, a reduced image of the mask pattern is formed on the wafer W located at the image surface. The reflection type projection optical system 100 shown in FIG. 1 has NA=0.10, reduction=¼, an object point of 60 to 70 mm, an image point of 15 to 17.5 mm, and an arc-shaped image surface with a width of 2.5 mm. Table 1 indicates the numerical values (such as radius of curvature, surface intervals, and coefficients of aspheric surfaces) of the reflection type projection optical system 100 shown in FIG. 1.

TABLE 1

| MIRROR NUMBERS | RADII OF CURVATURE | SURFACE INTERVALS | CONIC CONSTANTS K |
|---|---|---|---|
| OBJECT SURFACE (MS) | ∞ | 234.46897 | |
| STOP | ∞ | 576.33094 | |

TABLE 1-continued

| | | | |
|---|---|---|---|
| MIRROR 110 | −355.78008 | −146.50758 | 0.0 |
| MIRROR 120 | −282.65191 | 465.71345 | 0.0 |
| MIRROR 130 | 507.87891 | −293.29931 | 0.0 |
| MIRROR 140 | 373.62752 | 333.29931 | 0.0 |
| IMAGE SURFACE (W) | ∞ | — | — |

| COEFFICIENTS OF ASPHERIC SURFACES | A | B | C | D |
|---|---|---|---|---|
| MIRROR 110 | 2.81176E−10 | 2.68451E−15 | −2.38613E−20 | 1.18889E−24 |
| MIRROR 120 | 7.05932E−9 | 5.48402E−14 | −2.09417E−17 | 3.84035E−21 |
| MIRROR 130 | 1.81627E−8 | 1.72448E−12 | −8.55367E−15 | 3.59848E−17 |
| MIRROR 140 | 1.84243E−10 | 1.58331E−15 | −2.49463E−19 | 2.34439E−23 |

| COEFFICIENTS OF ASPHERIC SURFACES | E | F | G | H |
|---|---|---|---|---|
| MIRROR 110 | −8.43033E−30 | −1.71043E−34 | 3.16735E−39 | 0.000000E+00 |
| MIRROR 120 | −2.98026E−25 | −4.43923E−30 | 4.15397E−34 | 0.000000E+00 |
| MIRROR 130 | −8.98637E−20 | 1.22092E−22 | −6.92958E−26 | 0.000000E+00 |
| MIRROR 140 | 1.61815E−25 | −9.56542E−29 | 1.67470E−32 | 0.000000E+00 |

The reflection type projection optical system 100 shown in FIG. 1 includes such aberrations (calculated at several points on the image point) without manufacture errors that wavefront aberration is 0.006 λrms and maximum distortion is 2.2 nm. This is a diffraction limited optical system for a wavelength of 13.4 nm.

The reflection type projection optical system 100a has NA of 0.15, reduction of ¼, an object point of 96 to 100 mm, an image point of 24 to 25 mm, and an arc-shaped image surface with a width of 1.0 mm. Table 2 indicates the numerical values (such as radius of curvature, surface intervals, and coefficients of aspheric surfaces) of the reflection type projection optical system 100a shown in FIG. 2.

The reflection type projection optical system 100a shown in FIG. 2 includes such aberrations (calculated at several points on the image point) without manufacture errors that wavefront aberration is 0.030 λrms and maximum distortion is −4.1 nm. This is a diffraction limited optical system for a wavelength of 13.4 nm.

As described above, the inventive reflection type projection optical system 100 is a reflection type projection optical system that realizes a diffraction limited performance for the wavelength of EUV light without interference between the aperture stop and other reflected light, and includes no reflection surface near the aperture stop. In addition, a small inclination of the principal ray from the object and a small

TABLE 2

| MIRROR NUMBERS | RADII OF CURVATURE | SURFACE INTERVALS | CONIC CONSTANTS K |
|---|---|---|---|
| OBJECT SURFACE (MS) | ∞ | 317.97973 | |
| STOP | ∞ | 590.99926 | |
| MIRROR 110 | −377.39099 | −163.50961 | −0.00163 |
| MIRROR 120 | −312.82955 | 368.3488 | 0.34768 |
| MIRROR 130 | 538.03646 | −320.60016 | −0.34502 |
| MIRROR 140 | 424.27892 | 406.80719 | −0.02563 |
| IMAGE SURFACE (W) | ∞ | — | |

| COEFFICIENTS OF ASPHERIC SURFACES | A | B | C | D |
|---|---|---|---|---|
| MIRROR 110 | 2.02995E−10 | 7.46885E−15 | −1.49661E−19 | 1.77982E−24 |
| MIRROR 120 | 6.38179E−9 | 1.21899E−12 | −1.68675E−16 | 4.67738E−21 |
| MIRROR 130 | 1.22794E−8 | 3.10713E−13 | −1.91236E−16 | 3.81810E−19 |
| MIRROR 140 | 1.45533E−10 | 7.95038E−16 | −1.23797E−19 | −5.43231E−23 |

| COEFFICIENTS OF ASPHERIC SURFACES | E | F | G | H |
|---|---|---|---|---|
| MIRROR 110 | 2.33878E−29 | −7.54409E−34 | 5.51020E−39 | 0 |
| MIRROR 120 | 1.49874E−24 | −1.75832E−28 | 6.05826E−33 | 0 |
| MIRROR 130 | −5.66897E−22 | 4.11708E−25 | −1.03957E−28 | 0 |
| MIRROR 140 | 1.22491E−26 | −1.33599E−30 | 5.68825E−35 | 0 | reflection angle may reduce the aberration and obtain good imaging performance.

Figure 4:
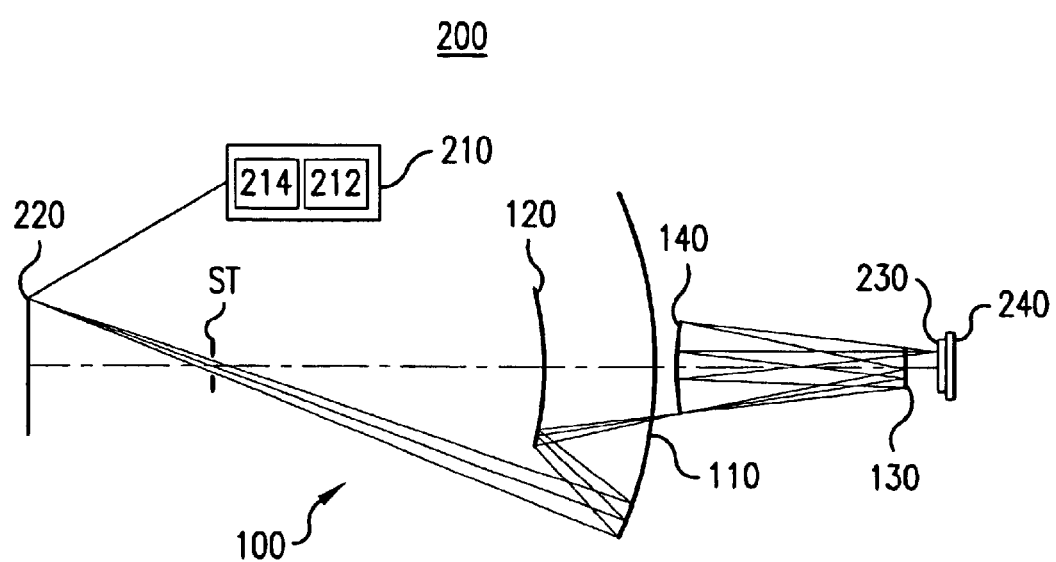
FIG. 4 is a schematic block diagram showing an exposure apparatus that includes a reflection type projection optical system shown in FIG. 1.

A description will be given below of an exposure apparatus 200 including the inventive reflection type projection optical system 100 with reference to FIG. 4. Here, FIG. 4 is a schematic block diagram showing an exposure apparatus 200 that includes a reflection type projection optical system 100 shown in FIG. 1. The exposure apparatus 200 includes, as shown in FIG. 4, an illumination apparatus 210, a reticle 220, a reflection type projection optical system 100, a plate 230, and a plate stage 240.

The exposure apparatus 200 uses EUV light (with a wavelength of, e.g., 13.4 nm) as illumination light for exposure, and exposes onto the plate 230 a circuit pattern created on the mask, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer. At least the optical path through which the EUV light travels should preferably be maintained in a vacuum atmosphere, although not shown in FIG. 4, since the EUV light has low transmittance for air.

The illumination apparatus 210 uses the EUV light (with a wavelength of, for example, 13.4 nm) to illuminate the reticle 220 that forms a circuit pattern to be transferred, and includes an EUV light source 212 and an illumination optical system 214.

The EUV light source 210 uses, for example, a laser plasma light source. The laser plasma light source irradiates a highly intensified pulse laser beam to a target material put in vacuum, thus generating high-temperature plasma for use as EUV light with a wavelength of about 13.4 nm emitted from this. The target material may use a metallic thin film, inert gas, and droplets, etc. The pulse laser preferably has high repetitive frequency, e.g., usually several kHz, for increased average intensity of the emitted EUV light. Alternatively, the EUV light source 212 may use a discharge plasma light source, which emits gas around an electrode put in vacuum, applies pulse voltage to the electrode for discharge, and induces high-temperature plasma. This plasma emits the EUV light, for example, with a wavelength of about 13.4 nm to be utilized. Of course, the EUV light source 212 is not limited to them, but may use any technology known in the art.

The illumination optical system 214 propagates the EUV light, illuminates the reticle 220, and includes a condenser optical system, an optical integrator, an aperture stop, a blade, etc. For example, the condenser optical system includes one or more mirrors for condensing EUV light that is radiated approximately isotropically from the EUV light source 212, and the optical integrator uniformly illuminates the reticle 220 with a predetermined aperture.

A debris eliminator (not shown) is preferably arranged between the EUV light source 212 and the illumination optical system 214 to eliminate debris generated concurrently when the EUV light is produced.

The reticle 220 is a reflection type reticle, and forms a circuit pattern (or image) to be transferred. It is supported and driven by a reticle stage (not shown). The diffracted light emitted from the reticle 220 is projected onto the plate 230 after reflected by the projection optical system 100. The reticle 220 and plate 230 are arranged optically conjugate with each other. Since the exposure apparatus 200 of this embodiment is a scanner, the reticle 220 and plate 230 are scanned with a reduction speed ratio to transfer a pattern on the reticle 220, onto the plate 230. Although the reticle 220 is implemented as a reflection type reticle, the projection optical system 100 reduces the inclination of the principal ray from the reticle 220, and thus is applicable to both the reflection type reticle and transmission type reticle.

Characteristically, the projection optical system 100 includes, in order of reflecting light from the reticle 220 side, the first (concave) mirror 110, second (convex) mirror 120, third (convex) mirror 130, and fourth (concave) mirror 140, and arranges the aperture stop ST closer to the reticle 220 side than the first to fourth mirrors 110 to 140. The reflection type projection optical system 100 may use any of the above embodiments, and a detailed description thereof will be omitted. Although FIG. 4 uses the reflection type optical system 100 shown in FIG. 1, the present invention is not limited to this illustrative embodiment.

The plate 230 is an exemplary object to be exposed, such as a wafer and a LCD, and photoresist is applied to the plate 230. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 230 is supported by the plate stage 240. The plate stage 240 may use any structure known in the art, and thus a detailed description of its structure and operations will be omitted. For example, the plate stage 240 uses a linear motor to move the plate 230 in X-Y directions. The reticle 220 and plate 230 are, for example, scanned synchronously, and the positions of the reticle stage (not shown) and plate stage 240 are monitored, for example, by a laser interferometer and the like, so that both are driven at a constant speed ratio. The plate stage 240 is installed on a stage stool supported on the floor and the like, for example, via a dumper, and the reticle stage and the projection optical system 100 are installed on a lens barrel stool (not shown) supported, for example, via a dumper to the base frame placed on the floor.

In exposure, the EUV light emitted from the EUV light source 212 illuminates the reticle 220 via the illumination optical system 214. The EUV light that has been reflected on the reticle 220 and reflects the circuit pattern is imaged on the plate 230 by the projection optical system 100.

Figure 5:
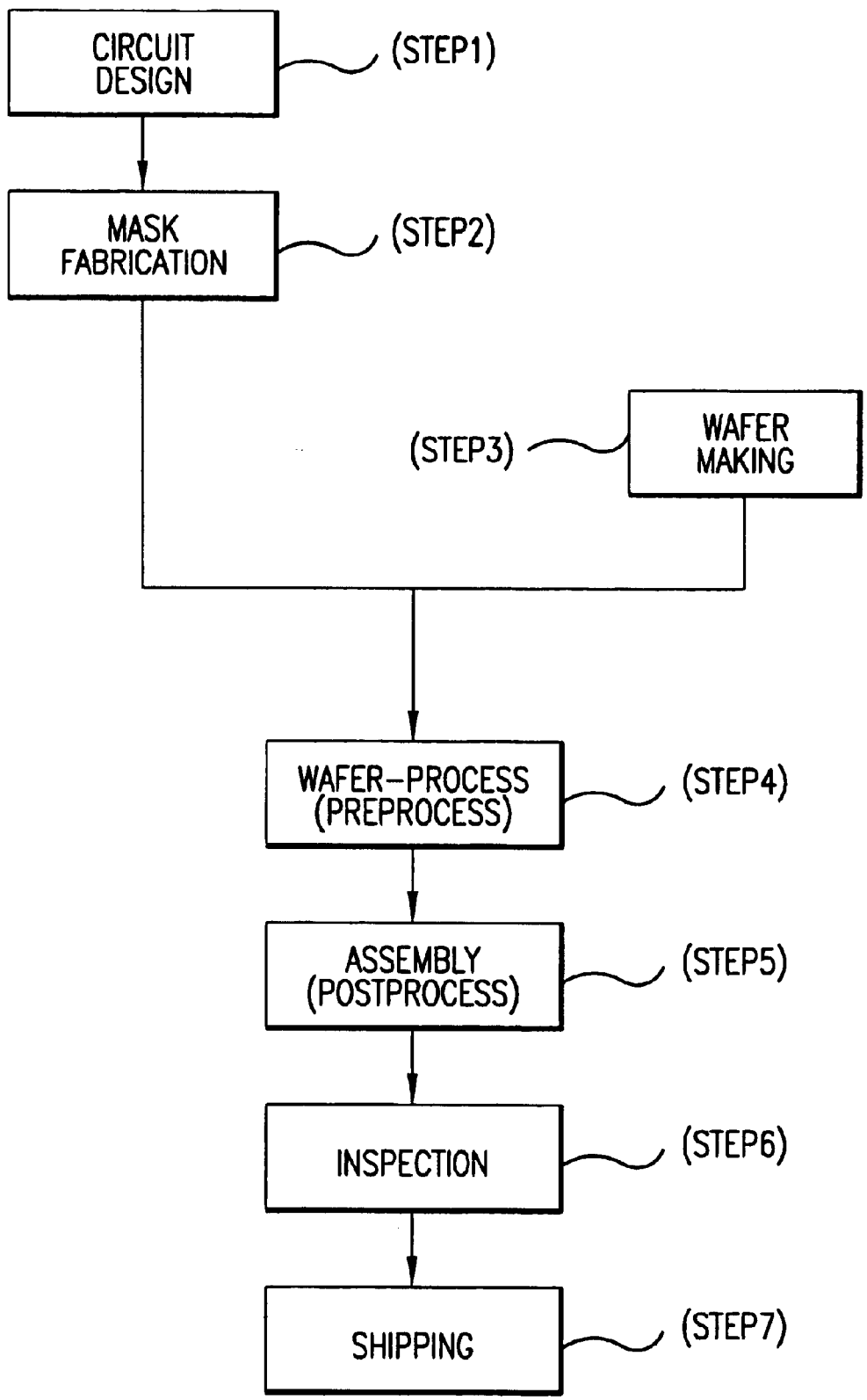
FIG. 5 is a flowchart for explaining a method for fabricating devices (semiconductor chips such as ICs, LSIs, and the like, LCDs, CCDs, etc.).
Figure 6:
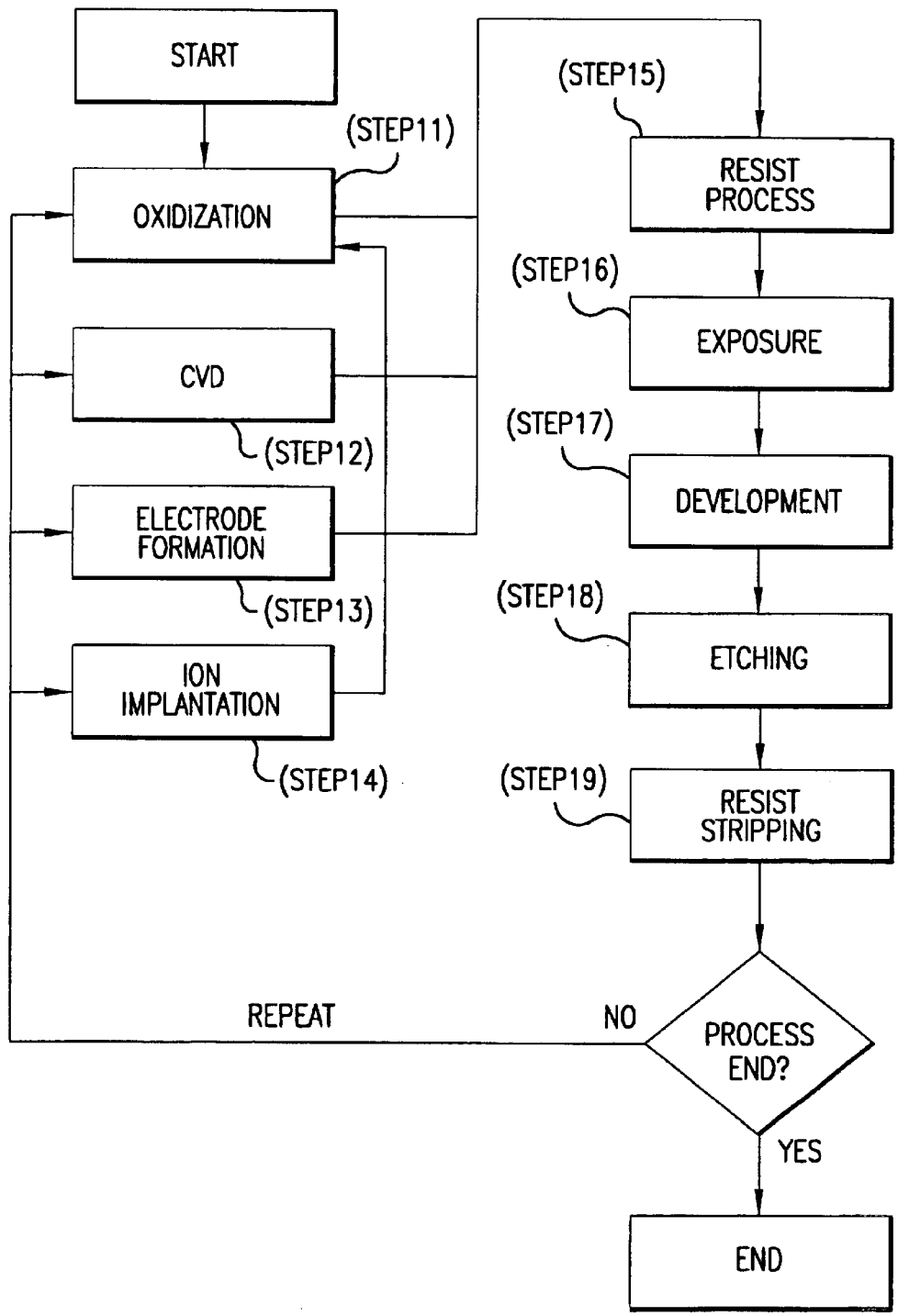
FIG. 6 is a detailed flowchart for Step 4 of wafer process shown in FIG. 5.
Figure 7:
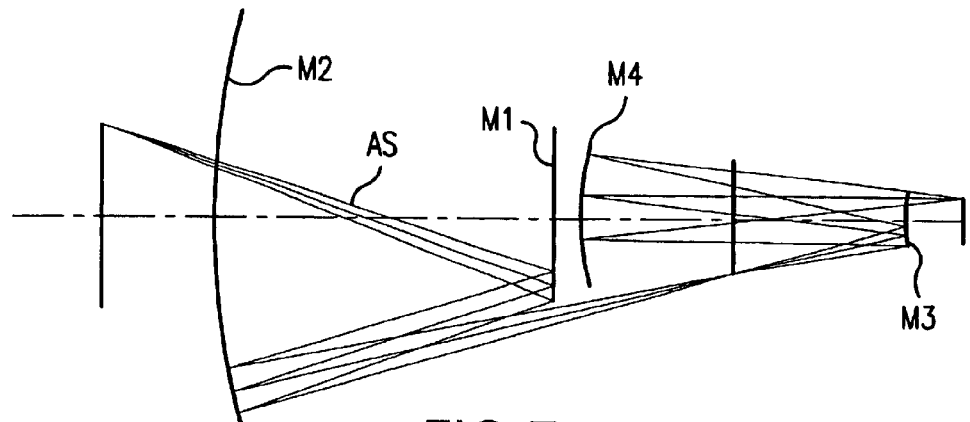
FIG. 7 is a schematic sectional view of a conventional reflection type projection optical system.
Figure 8:
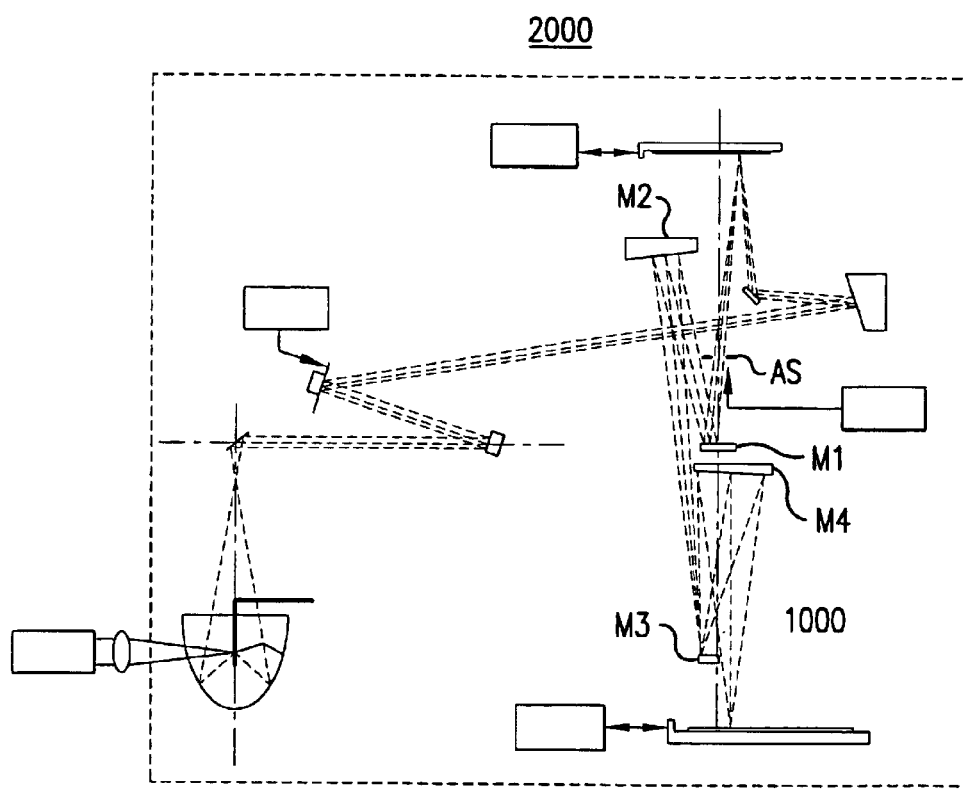
FIG. 8 is a schematic block diagram showing an exposure apparatus incorporated with the conventional reflection type projection optical system.

Referring to FIGS. 5 and 6, a description will now be given of an embodiment of a device fabricating method using the above mentioned exposure apparatus 200. FIG. 5 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4 shown in FIG. 5. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the reflection type projection optical system of this embodiment has a coaxial system having a rotationally symmetrical aspheric surface, but it may have a rotationally asymmetrical aspheric surface. The present invention is applicable a reflection type projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

Thus, according to the inventive reflection type projection optical system, the minimum four-mirror system may improve the reflectance in the optical system and enable only one circular aperture stop to be arranged since no reflected light pass near the aperture stop. The arrangement that does not have a mirror reflection surface at the aperture stop position may provide an optical system having excellent imaging performance by preventing interference between a ray of projected light and a mirror. Therefore, the exposure apparatus having this reflection type projection optical system may provide high quality devices with excellent exposure performance including a throughput.

What is claimed is:

1. A reflection type projection optical system for projecting a pattern on an object surface onto an image surface and for serving as an imaging system that forms an intermediate image between the object surface and image surface, said reflection type projection optical system comprising four or more mirrors arranged substantially as a coaxial system to reflect light from an object side to an image side, and reflection surfaces on the four or more mirrors forming the same direction for forming a reflection angle, wherein said reflection type projection optical system is a twice-imagine system, and the four or more mirrors include, in order along an optical path from the intermediate image to the image surface, a convex mirror whose convex surface faces the object side, and a concave mirror whose concave surface faces the image side, and wherein said reflection type projection optical system images only off axis light incident upon the object surface onto the image surface.

2. A reflection type projection optical system according to claim 1, further comprising an aperture stop closer to the object side than the four or more mirrors and arranging the four or more mirrors between the aperture stop and the image surface.

3. A reflection type projection optical system according to claim 1, wherein the four or more mirrors include two mirrors between the object surface and the intermediate image.

4. A reflection type projection optical system according to claim 3, wherein the two mirrors include, in order along an optical path from the object surface to the intermediate image, a concave mirror whose concave surface faces the object side, and a convex mirror whose convex surface faces the image side.

5. A reflection type projection optical system according to claim 1, wherein at least one of said mirrors includes an aspheric mirror including a multilayer film.

6. A reflection type projection optical system according to claim 1, wherein all of said mirrors include aspheric mirrors each including a multilayer film.

7. A reflection type projection optical system according to claim 1, wherein the light has a wavelength of 200 nm or less.

8. A reflection type projection optical system according to claim 1, wherein the light is extreme ultraviolet light having a wavelength of 20 nm or less.

9. A reflection type projection optical system according to claim 1, wherein said reflection type projection optical system is telecentric at the image surface side.

10. A reflection type projection optical system for projecting a pattern on an object surface onto an image surface, said reflection type projection optical system comprising four mirrors that include, in order from an object side to an image side, a concave mirror, a convex mirror, a convex mirror and a concave mirror, and substantially form a coaxial system, and said four mirrors serving as a twice-imaging system that forms an intermediate image between the object side and the image side, wherein said reflection type projection optical system images only off axis light incident upon the object surface onto the image surface.

11. A reflection type projection optical system according to claim 10, wherein at least one of said mirrors includes an aspheric mirror including a multilayer film.

12. A reflection type projection optical system according to claim 10, wherein all of said mirrors include aspheric mirrors each including a multilayer film.

13. A reflection type projection optical system according to claim 10, wherein the light has a wavelength of 200 nm or less.

14. A reflection type projection optical system according to claim 10, wherein the light is extreme ultraviolet light having a wavelength of 20 nm or less.

15. A reflection type projection optical system according to claim 10, wherein said reflection type projection optical system is telecentric at the image surface side.

16. An exposure apparatus that uses ultraviolet light, far ultraviolet light, vacuum ultraviolet light or extreme ultraviolet light as exposure light and irradiates the exposure light onto an object to be exposed through a reflection type projection optical system so as to expose the object, wherein said reflection type projection optical system is adapted to project a pattern on an object surface onto an image surface and to serve as an imaging system that forms an intermediate image between the object surface and image surface, said reflection type projection optical system comprising four or more mirrors arranged substantially as a coaxial system to reflect light from an object side to an image side, reflection surfaces on the four or more mirrors forming the same direction for forming a reflection angle, wherein said reflection type projection optical system images only off axis light incident upon the object surface onto the image surface.

17. An exposure apparatus that uses ultraviolet light, far ultraviolet light, vacuum ultraviolet light or extreme ultraviolet light as exposure light and irradiates the exposure light onto an object to be exposed through a reflection type projection optical system so as to expose the object, wherein said reflection type projection optical system is adapted to project a pattern on an object surface onto an image surface, said reflection type projection optical system comprising four mirrors that include, in order from an object side to an image side, a concave mirror, a convex mirror, a convex mirror and a concave mirror, and substantially form a coaxial system, said four mirrors serving as a twice-imaging system that forms an intermediate image between the object side and the image side, wherein said reflection type projection optical system images only off axis light incident upon the object surface onto the image surface.

18. A device fabricating method comprising the steps of:

exposing an object using an exposure apparatus; and performing a predetermined process for the exposed object, wherein said exposure apparatus uses ultraviolet light, far ultraviolet light, vacuum ultraviolet light or extreme ultraviolet light as exposure light and irradiates the exposure light onto the object through a reflection type projection optical system so as to expose the object, wherein said reflection type projection optical system is adapted to project a pattern on an object surface onto an image surface and to form an imaging system that forms an intermediate image between the object surface and image surface, said reflection type projection optical system comprising four or more mirrors arranged substantially as a coaxial system to reflect light from an object side to an image side, reflection surfaces on the four or more mirrors forming the same direction for forming a reflection angle, wherein said reflection type projection optical system is a twice-imaging system, and the four or more mirrors include, in order along an optical path from the intermediate image to the image surface, a convex mirror whose convex surface faces the object side, and a concave mirror whose concave surface faces the image side, and wherein said reflection type projection optical system images only off axis light incident upon the object surface onto the image surface.

19. A device fabricating method comprising the steps of:

exposing an object using an exposure apparatus; and performing a predetermined process for the exposed object, wherein the exposure apparatus uses ultraviolet light, far ultraviolet light, vacuum ultraviolet light or extreme ultraviolet light as exposure light and irradiates the exposure light onto the object through a reflection type projection optical system so as to expose the object, wherein said reflection type projection optical system is adapted to project a pattern on an object surface onto an image surface, said reflection type projection optical system comprising four mirrors that include, in order from an object side to an image side, a concave mirror, a convex mirror, a convex mirror and a concave mirror, and substantially form a coaxial system, said four mirrors serving as a twice-imaging system that forms an intermediate image between the object side and the image side, and wherein said reflection type projection optical system images only off axis light incident upon the object surface onto the image surface.

* * * * *

UNITED STATES PATENT AND TRADEMARK OFFICE
CERTIFICATE OF CORRECTION

PATENT NO. : 6,860,610 B2
DATED : March 1, 2005
INVENTOR(S) : Terasawa

It is certified that error appears in the above-identified patent and that said Letters Patent is hereby corrected as shown below:

Title page,
Item [56], References Cited, FOREIGN PATENT DOCUMENTS, add:
-- JP     98228          7/2000 --; and Column 11,
Line 64, delete "twice-imagine" and insert therefor -- twice-imaging --.

Signed and Sealed this

Sixth Day of September, 2005

JON W. DUDAS
*Director of the United States Patent and Trademark Office*